(12) United States Patent
Yu et al.

(10) Patent No.: US 8,890,274 B2
(45) Date of Patent: Nov. 18, 2014

(54) INTERCONNECT STRUCTURE FOR CIS FLIP-CHIP BONDING AND METHODS FOR FORMING THE SAME

(75) Inventors: Chen-Hua Yu, Hsin-Chu (TW); Yung Ching Chen, Dali (TW); Chien-Hsun Lee, Chu-tung Town (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 13/546,847

(22) Filed: Jul. 11, 2012

(65) Prior Publication Data

US 2014/0015086 A1    Jan. 16, 2014

(51) Int. Cl.
*H01L 23/48*    (2006.01)

(52) U.S. Cl.
USPC .......................................... 257/460

(58) Field of Classification Search
CPC ....... H01L 23/481; H01L 24/05; H01L 24/06; H01L 24/48
USPC ........................................ 257/460
See application file for complete search history.

(56) References Cited

U.S. PATENT DOCUMENTS

2006/0261446 A1* 11/2006 Wood et al. ................... 257/621
2011/0024867 A1   2/2011 Tseng et al.

FOREIGN PATENT DOCUMENTS

WO    2006124295    11/2006

OTHER PUBLICATIONS

Couts, Philip, "Thermosonic Gold to Gold Intermetallic Advantages for CSP Camera Module Interconnect," Sep. 2010, 8 pgs.

* cited by examiner

*Primary Examiner* — Thomas L Dickey
(74) *Attorney, Agent, or Firm* — Slater & Matsil, L.L.P.

(57) ABSTRACT

A device includes a metal pad at a surface of an image sensor chip, wherein the image sensor chip includes an image sensor. A stud bump is disposed over, and electrically connected to, the metal pad. The stud bump includes a bump region, and a tail region connected to the bump region. The tail region includes a metal wire portion substantially perpendicular to a top surface of the metal pad. The tail region is short enough to support itself against gravity.

20 Claims, 4 Drawing Sheets

INTERCONNECT STRUCTURE FOR CIS FLIP-CHIP BONDING AND METHODS FOR FORMING THE SAME

BACKGROUND

Backside Illumination (BSI) image sensor chips are replacing front-side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon chip.

BSI chips are used in various electric device applications, in which the BSI chips are bonded to ceramic substrates.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure of an image sensor chip and the method of forming the same are provided in accordance with various exemplary embodiments. The intermediate stages of forming a package including an image sensor chip are illustrated. The variations of the embodiments are discussed. Throughout the various views and illustrative embodiments, like reference numbers are used to designate like elements.

Figure 1:
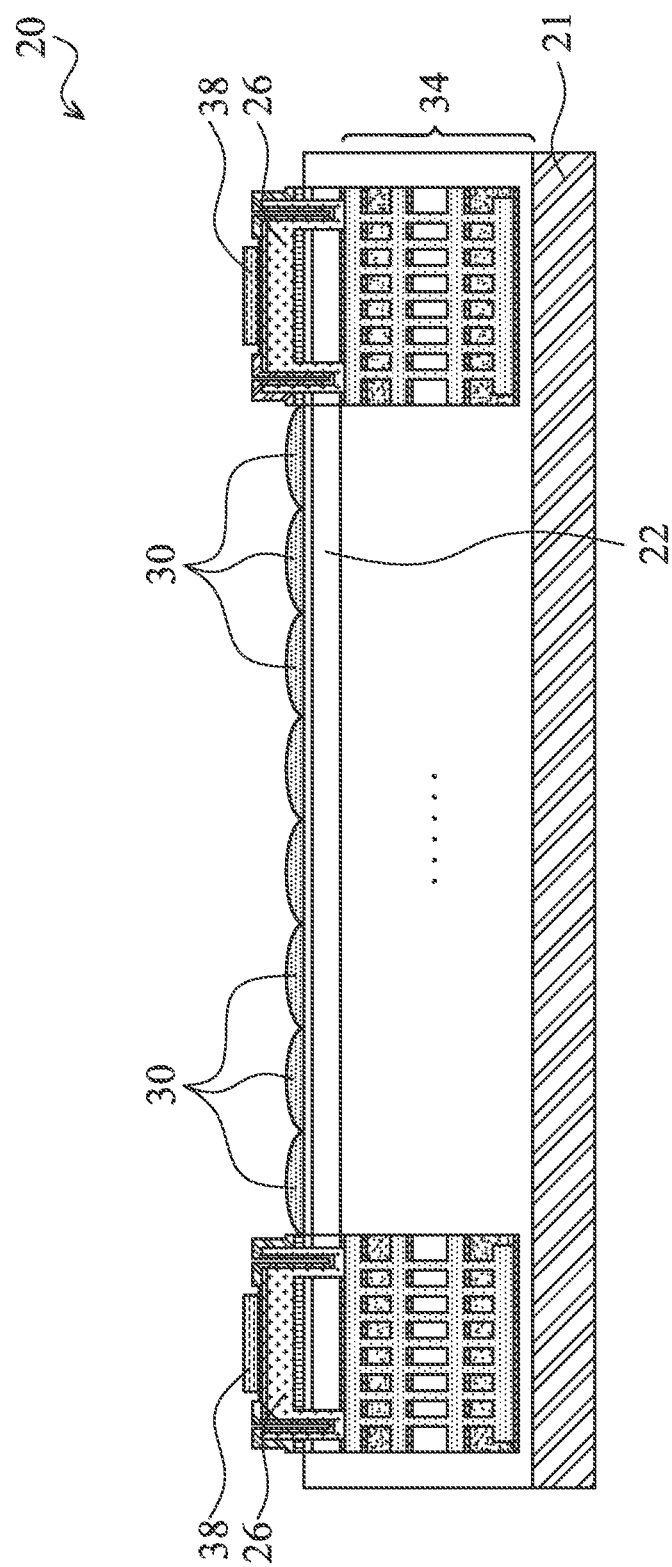
FIGS. 1 through 4 are cross-sectional views of intermediate stages in the packaging of an image sensor chip in accordance with some exemplary embodiments.

FIG. 1 illustrates a cross-sectional view of image sensor chip 20. In some embodiments, image sensor chip 20 is a Backside Illumination (BSI) image sensor chip. In alternative embodiments, image sensor chip 20 is a front-side illumination image sensor chip. Image sensor chip 20 includes semiconductor substrate 22, which may be a silicon substrate. Alternatively, substrate 22 is formed of other semiconductor materials such as silicon germanium, silicon carbon, a III-V compound semiconductor, or the like. Image sensors 24 (not shown in FIG. 1, please refer to FIG. 2), which may be photo diodes, are formed in image sensor chip 20.

Figure 2:
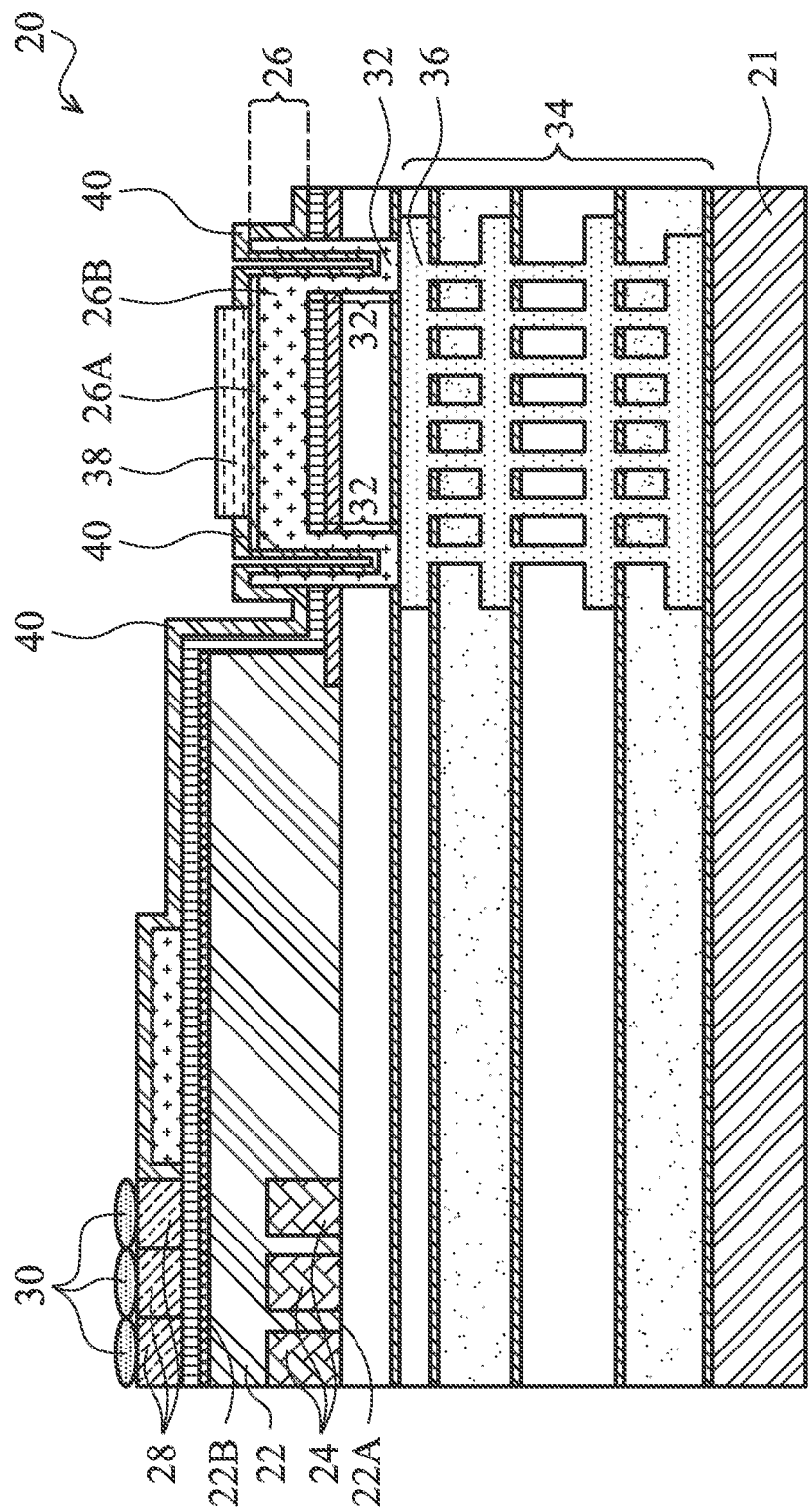

FIG. 2 illustrates a magnified view of portion 100 of image sensor chip 20. Image sensor chip 20 may include carrier 21, which on the front side of image sensor chip 20 and bonded to a dielectric layer. As shown in FIG. 2, image sensor chip 20 includes image sensors 24, which are disposed at front surface 22A of semiconductor substrate 22. Image sensors 24 may form an array that includes a plurality of rows and a plurality of columns. On the backside of semiconductor substrate 22 and over back surface 24B of semiconductor substrate 22, there are a plurality of color filters 28 and a plurality of micro-lenses 30. Each of color filters 28 and micro-lenses 30 is aligned to one of image sensors 24. Light may penetrate through micro-lenses 30, color filters 28, and is received by image sensors 24. Image sensors 24 may convert the light into an electrical signal.

Metal pad 26 is formed on the backside of image sensor chip 20, and is used to electrically connect to the circuits in image sensor chip 20. In some embodiments, metal pad 26 comprises copper, aluminum, nickel, and/or the like. Metal pad 26 is connected to front-side interconnect structure 34 through conductive vias 32, which penetrate through semiconductor substrate 22. In the illustrated embodiments, conductive vias 32 may be metal vias that are formed at the same time a portion of metal pad 26 is formed. Metal vias 32 may land on metal pad 36, which may be in a bottom metal layer of front-side interconnect structure 34.

In some embodiments, metal pad 26 includes metal finish 26A on aluminum-containing pad 26B, which may comprise aluminum copper. Metal finish 26A may include a nickel layer, a palladium layer, Electroless Nickel Immersion Gold (ENIG), Electroless Nickel Electroless Palladium (ENEP), Electroless Nickel Electroless Palladium Immersion Gold (ENEPIG), Immersion Tin (ImSn), Immersion Silver (ImAg), Immersion Gold (ImAu), or the like. The formation of metal finish 26A may thus include immersion, plating, or the like. Furthermore, solder layer 38 is formed on the top of metal pad 26. Solder layer 38 may be formed of eutectic solder, lead free solder, or the like. Passivation layer 40, which may be formed of an oxide layer (such as a silicon oxide layer) and a nitride layer (such as a silicon nitride layer) over the oxide layer, is formed to cover some surfaces of metal pad 26 and conductive vias 32, wherein a center portion of metal pad 26 or solder layer 38 is exposed through an opening in passivation layer 40. Solder layer 38, when formed, may be in contact with metal pad 26 through the opening in passivation layer 40.

Figure 3:
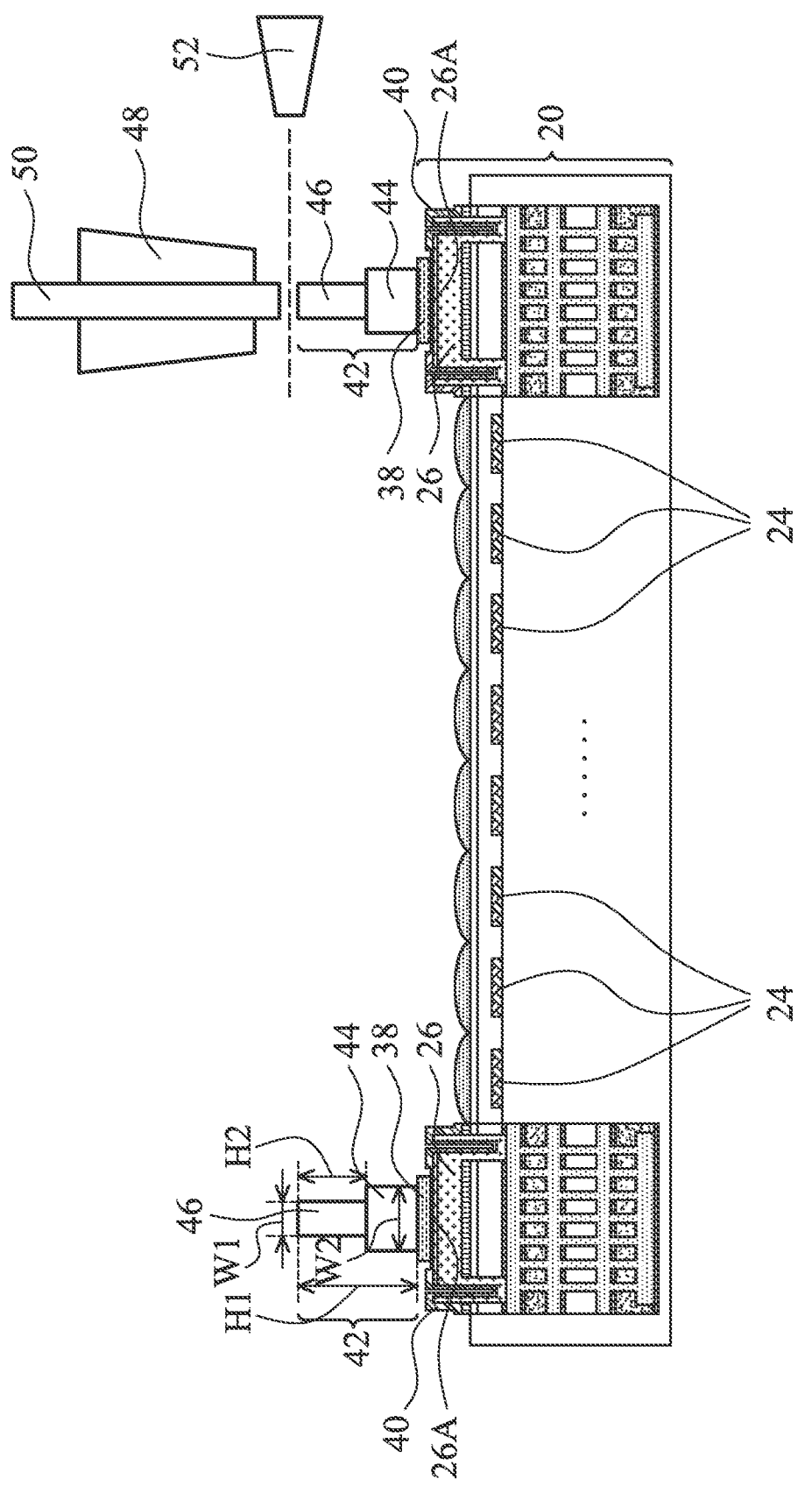

FIG. 3 illustrates the formation of stud bumps 42 on solder layers 38. In the embodiments wherein no solder layer is formed on metal pads 26, stud bumps 42 are formed on and contacting metal pads 26. Otherwise, stud bumps 42 are formed over and in contact with solder layers 38. Exemplary stud bumps 42 include bump regions 44 and tail regions 46. Tail regions 46 are also metal wires that have a substantially uniform dimension (such as a diameter, depending on the shape of the cross-sectional area of tail region 46). In some illustrative embodiments, stud bumps 42 have height H1, which may range from about 50 µm to about 200 µm. Height H2 of tail region 46 may range from about 20 µm to about 170 µm. Height H2 may also be greater than about 200 µm or greater than about 300 µm in some exemplary embodiments.

Stud bumps 42 may be formed through a wire bonding method. In some exemplary embodiments, the formation of stud bumps 42 is performed through capillary 48 of a bonder, wherein metal wire 50 passes through a hole in capillary 48. Metal wire 50 may be a gold wire, a copper wire, a copper wire coated with palladium, or the like. In an exemplary formation process of a stud bump 42, a metal ball (not shown) is first formed at the tip of wire 50, for example, by providing a spark to melt the tip of wire 50. Capillary 48 is then driven down to bond the metal ball on solder layer 38 to form bump region 44. Next, capillary 48 moves up when metal wire 50 is still attached to bump region 44. Metal wire 50 is then cut at a desirable position. When metal wire 50 is cut, metal wire 50 is maintained at an upright position. The cutting of metal wire 50 may be performed, for example, by projecting a laser on metal wire 50, wherein the laser is generated by laser generating device 52. Alternatively, the cutting of metal wire 50 may be performed using a clamp, a blade, or the like.

After the cutting, a portion of metal wire 50 is left on bump region 44 to form tail region 46. Tail region 46 may be substantially upright, with a lengthwise direction of tail region 46 substantially perpendicular to top surface 26A of the respective metal pad 26. Tail region 46 may support itself against the pull of gravity, so that the tail region 46 remains upright when no external force is applied. Tail region 46 may include a portion having a uniform dimension (such as diameter), which dimension is the same as the dimension and the shape of metal wire 50. Furthermore, a cross-sectional shape of tail region 46 is the same as the cross-sectional shape of metal wire 50. Width W1 of the top portion and width W2 of the bottom portion of tail region 46 are substantially equal to each other.

Figure 4:
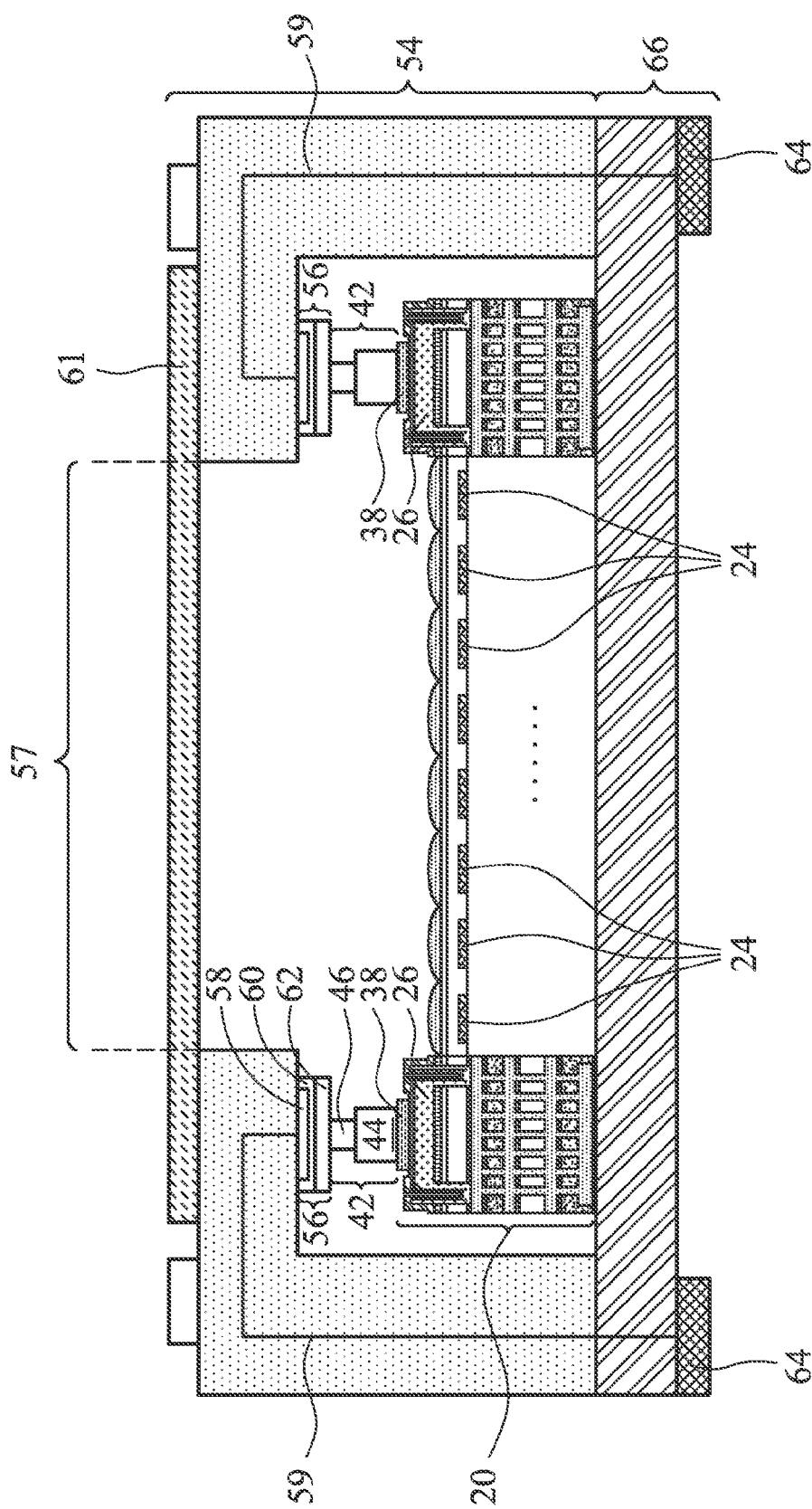

FIG. 4 illustrates the bonding of image sensor chip 20 to substrate 54. In some embodiments, substrate 54 comprises electrical connectors 56, to which stud bumps 42 are bonded. Substrate 54 further includes window 57, through which light may penetrate to reach image sensor 24. Glass cover 61 covers window 57 to protect image sensor chip 20, and at the same time allows light to pass through.

Image sensor chip 20 is bonded to substrate 54 through flip-chip bonding, wherein stud bumps 42 are bonded to electrical connectors 56 of substrate 54. Substrate 54 may be a ceramic-based substrate, wherein metal traces 59 are formed in substrate 54 for electrically connecting to electrical connectors 56. In some embodiments, electrical connectors 56 include metal pads 58, metal finishes 60 on metal pads 58, and/or solder layers 62 on metal finishes 60. In alternative embodiments, electrical connectors 56 do not include metal finishes 60 and/or solder layers 62. Metal pads 58 may be formed of aluminum, copper, nickel, and/or the like. Metal finishes 60 may be formed of nickel, palladium, gold, silver, tin, and/or the like, and may be formed using immersion, plating, ENIG, ENEP, ENEPIG, or the like.

In some embodiments, when bonding image sensor chip 20 to substrate 54, substrate 54 is heated to a temperature lower than the melting temperature of solder layer 62, so that solder layer 62 is softened, by not melted. Accordingly, tail regions 46 of stud bumps 42 have a good contact with electrical connectors 56. Bump regions 44 of stud bumps 42, however, may not be in contact with electrical connectors 56. Furthermore, substrate 54 may be bonded to Printed Circuit Board (PCB) 66, for example, through an Anisotropic Conductive Film (ACF, not shown) therebetween. Electrical connectors 56 are thus electrically connected to metal pads 64 of PCB 66.

In the embodiments, with the formation of stud bumps 42 that include tail regions 46, one stud bump, rather than stacked stud bumps, is formed on each of metal pads 26. It is appreciated that if the stacked stud bumps are to be formed, the formation of each of the stacked stud bumps incurs the risk of damaging image sensor chip 20, which is very thin. Therefore, with one stud bump needed on each of metal pads 26, the risk of breaking image sensor chip 20 is reduced. Furthermore, solder layer 38, which is relatively soft, absorbs the pumping force in the bonding of stud bumps 42. Solder layers 38 and 62 may also improve the reliability of the flip-chip bond.

In accordance with embodiments, a device includes a metal pad at a surface of an image sensor chip, wherein the image sensor chip includes an image sensor. A stud bump is disposed over, and electrically connected to, the metal pad. The stud bump includes a bump region, and a tail region connected to the bump region. The tail region includes a metal wire portion substantially perpendicular to a top surface of the metal pad. The tail region is short enough to support itself against gravity.

In accordance with other embodiments, a device includes an image sensor chip, which includes a semiconductor substrate, an image sensor at a front side of the semiconductor substrate, and a metal pad on a backside of the semiconductor substrate. A solder layer is disposed over the metal pad. A stud bump is disposed over the solder layer and electrically coupled to the metal pad through the solder layer, wherein the stud bump includes a bump region, and a tail region attached to the bump region.

In accordance with yet other embodiments, a method includes forming a solder layer on a metal pad of an image sensor chip, wherein the image sensor chip includes an image sensor, bonding a metal wire on the solder layer, and cutting the metal wire to form a stud bump on the solder layer. The stud bump includes a bump region, and a tail region connected to the bump region. The tail region is short enough to support itself against gravity.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a metal pad at a surface of an image sensor chip, wherein the image sensor chip comprises an image sensor;
   a stud bump over, and electrically connected to, the metal pad, wherein the stud bump comprises a bump region, and a tail region connected to the bump region, wherein the tail region comprises a metal wire portion substantially perpendicular to a top surface of the metal pad, and wherein the tail region is short enough to support itself against gravity; and
   a substrate comprising:
      a first portion overlapping a portion of the image sensor chip, wherein the first portion of the substrate comprises an electrical connector in contact with the tail region of the stud bump; and
      a second portion connected to the first portion, wherein the second portion comprises a lower end level with a bottom surface of the image sensor chip.

2. The device of claim 1 further comprising a solder layer over the metal pad and underlying the stud bump.

3. The device of claim 2, wherein the electrical connector of the first portion of the substrate comprises the solder layer in contact with the tail region of the stud bump.

4. The device of claim 1, wherein the substrate comprises a window, with image sensors of the image sensor chip aligned to the window, and wherein the device further comprises a glass cover covering the window of the substrate.

5. The device of claim 1, wherein the metal pad comprises a metal finish as a top part of the metal pad.

6. The device of claim 1, wherein the metal wire portion is substantially straight, and has a lengthwise direction perpendicular to a top surface of the metal pad.

7. The device of claim 1 further comprising a printed circuit board, with the image sensor chip and a lower end of the second portion of the substrate attached to the printed circuit board, wherein the substrate further comprises a metal trace connecting the electrical connector of the second portion of the substrate to the printed circuit board.

8. The device of claim 1, wherein the image sensor chip is configured to receive light into the image sensor from a backside of the image sensor chip, and wherein the tail region is on the backside of the image sensor chip.

9. A device comprising:
 an image sensor chip comprising:
  a semiconductor substrate;
  an image sensor at a front side of the semiconductor substrate, wherein the image sensor chip is configured to allow the image sensor to receive light from a backside of the image sensor chip; and
  a metal pad on the backside of the semiconductor substrate;
 a solder layer over the metal pad; and
 a stud bump over the solder layer and electrically coupled to the metal pad through the solder layer, wherein the stud bump comprises a bump region, and a tail region comprising a metal wire portion having a substantially uniform size attached to the bump region, wherein the tail region is on the backside of the image sensor chip.

10. The device of claim 9, wherein the metal wire portion has a height between about 20 μm and about 170 μm.

11. The device of claim 9, wherein the metal wire portion is substantially perpendicular to a top surface of the metal pad, and is short enough to support itself against gravity.

12. The device of claim 9, wherein the bump region contacts the solder layer, and wherein a first end of the tail region contacts the bump region, and a second end of the tail region is not in contact with addition conductive features.

13. The device of claim 9, wherein the image sensor chip further comprises an interconnect structure electrically coupled to the stud bump, wherein the interconnect structure and the tail region are on opposite sides of the semiconductor substrate.

14. The device of claim 9 further comprising:
 a substrate comprising:
  a first portion overlapping a portion of the image sensor chip, wherein the first portion of the substrate comprises an electrical connector in contact with the tail region of the stud bump; and
  a second portion connected to the first portion, wherein the second portion comprises a lower end level with a bottom surface of the image sensor chip.

15. The device of claim 14, wherein the electrical connector of the substrate comprises a solder layer in contact with the tail region of the stud bump.

16. The device of claim 14, wherein the substrate comprises a window, and image sensors of the image sensor chip are aligned to the window, and wherein the device further comprises a glass cover covering the window of the substrate.

17. A device comprising:
 a metal pad at a surface of an image sensor chip, wherein the image sensor chip comprises an image sensor;
 a stud bump over, and electrically connected to, the metal pad, wherein the stud bump comprises a bump region, and a tail region connected to the bump region, wherein the tail region comprises a metal wire portion substantially perpendicular to a top surface of the metal pad, and wherein the tail region is short enough to support itself against gravity; and
 a substrate comprising:
  a first portion overlapping a portion of the image sensor chip, wherein the first portion of the substrate comprises:
   a bottom surface facing the tail region; and
   an electrical connector protruding below the bottom surface, wherein the electrical connector is in contact with the tail region of the stud bump.

18. The device of claim 17, wherein the substrate further comprises a second portion connected to the first portion, wherein the second portion comprises a lower end level with a bottom surface of the image sensor chip.

19. The device of claim 18 further comprising a printed circuit board, with the image sensor chip and a lower end of the second portion of the substrate attached to the printed circuit board, and wherein the substrate further comprises a metal trace connecting the electrical connector of the second portion of the substrate to the printed circuit board.

20. The device of claim 17, wherein the image sensor chip is configured to receive light into the image sensor from a backside of the image sensor chip, and wherein the tail region is on the backside of the image sensor chip.

* * * * *